(12) United States Patent
Kubo et al.

(10) Patent No.: US 6,468,881 B1
(45) Date of Patent: Oct. 22, 2002

(54) METHOD FOR PRODUCING A SINGLE CRYSTAL SILICON

(75) Inventors: Takayuki Kubo, Hyogo (JP); Masanori Kuwahara, Osaka (JP)

(73) Assignee: Sumitomo Metal Industries, Ltd., Osaka (JP)

(*) Notice: Subject to any disclaimer, the term of this patent is extended or adjusted under 35 U.S.C. 154(b) by 0 days.

(21) Appl. No.: 09/618,790

(22) Filed: Jul. 18, 2000

(51) Int. Cl.⁷ .............................................. H01L 21/46
(52) U.S. Cl. ..................... 438/460; 117/19; 438/471; 438/502; 438/503
(58) Field of Search ..................... 438/471, 502–505, 438/916–918; 257/610, 611, 617, 913

(56) References Cited

U.S. PATENT DOCUMENTS

| | | | | |
|---|---|---|---|---|
| 6,139,625 A | * | 10/2000 | Tamatsuka et al. | 117/19 |
| 6,261,361 B1 | * | 7/2001 | Iida et al. | 117/19 |
| 6,291,874 B1 | * | 9/2001 | Tamatsuka | 257/610 |

FOREIGN PATENT DOCUMENTS

| | | |
|---|---|---|
| JP | 60251190 A | 12/1985 |
| JP | 05294780 A | 11/1993 |
| JP | 06271399 A | 9/1994 |
| JP | 08091993 | 4/1996 |
| JP | 10098047 | 4/1998 |

* cited by examiner

Primary Examiner—David Nelms
Assistant Examiner—Dung Anh Le
(74) Attorney, Agent, or Firm—Morrison & Foerster, LLP

(57) ABSTRACT

A single crystal silicon is produced using a Czocharalski (CZ) method. Silicon nitride powder is put in the bottom of a quartz crucible to provide a nitrogen concentration in the single crystal silicon of not less than about $1\times10^{13}$ atoms/$cm^3$. A poly-silicon raw material is then charged in the crucible. A pulling rate for the single crystal silicon is low so that an oxidation induced stacking faults ring exists or disappears at the center. Maintaining the nitrogen concentration of the single crystal silicon to not less than $1\times10^{13}$ atoms/$cm^3$ decrease the vacancy cluster and existinguish the dislocation cluster. Wafers prepared from the single crystal silicon have very high quality with minimal defects.

7 Claims, 1 Drawing Sheet

METHOD FOR PRODUCING A SINGLE CRYSTAL SILICON

BACKGROUND OF THE INVENTION

1. Field of the Invention

The present invention relates to silicon wafers utilized in the manufacture of semiconductor devices and to a method for producing a single crystal silicon used to prepare the wafers.

2. Discussion of the Background

A silicon wafer used in the manufacture of semiconductor devices may be obtained from a single crystal rod prepared by the Czochralski (CZ) method. In the CZ method, a silicon seed crystal is dipped into the silicon melt in a quartz crucible, and the seed crystal is then pulled up from the silicon melt while the seed crystal and the quartz crucible are rotated in opposite directions. The single crystal rod obtained is then sliced or otherwise processed to yield single crystal wafers.

Silicon wafers manufactured from the single crystal rod produced by the CZ method are known to have oxidation induced stacking faults on the surface due to thermal oxidation. The oxidation induced stacking faults usually generate in a ring shape and the area generated by the oxidation induced stacking faults is referred to as an OSF ring. In this application, the area where an OSF ring will generate after thermal oxidation but there is not an OSF ring because it is not receiving thermal oxidation, is also referred to as an OSF ring.

The OSF ring causes deterioration in the properties of semiconductor devices manufactured from the wafers. It has been observed that the physical properties of the outer portion of the ring differ from the properties of the inner portion of the ring. Dislocation clusters formed by aggregation of interstitial atoms are frequently generated on the outer portion of the OSF ring. However, the clusters seldom generate on the inner portion of the OSF ring. It is also known that an OSF ring will shift toward the outer region of a single crystal silicon as the pulling rate increases.

Because of the above circumstances, it has been observed that a single crystal silicon produced at a high pulling rate would have an OSF ring at the outermost peripheral region of the crystal. This region is not useful for forming semiconductor devices.

The inner portion of the OSF ring likewise presents problems. A cluster formed by aggregation of vacancy (i.e., vacancy cluster) is generated in this portion. This cluster causes a small pit when the surface of the wafer is etched. Since the pit is very small, this normally does not create a problem. However, since the integration density has significantly increased in recent years and pattern widths have become significantly finer, the presence of vacancy clusters is a problem for high grade single crystals.

A vacancy cluster does not exist on an epitaxial wafer produced from a single crystal silicon. Since epitaxial wafers are expensive, a single crystal silicon having low vacancy clusters has been produced by the CZ method. From this point of view, a lower pulling rate in contrast to the conventional method is desirable with respect to the production of a high grade crystal. A low pulling rate method is employed so that the OSF rings are generated on the inner portion rather than the outermost peripheral portion of the pulled crystal. In this way, defects are concentrated at the center of the crystal, or the OSF rings are caused to disappear at the center in order to provide improved yields of device.

With respect to the CZ method in which a high pulling rate is used so that the OSF rings are distributed at the outermost peripheral portion of the crystal, it is known that nitrogen doping to the silicon melt suppress the generation of vacancy clusters at the inner portion of the OSF ring. Japanese Patent Laid-Open No. 6-271399 discloses a nitrogen doping method by silicon nitride powder or nitrogen gas to the silicon melt. In addition, Japanese Patent Laid-Open No. 5-294780 discloses methods in which a poly-silicon is melted in an atmosphere of nitrogen gas, or a Float Zone silicon with nitrogen or a wafer which is coated with CVD silicon nitride film is used to add nitrogen to the poly-silicon.

SUMMARY OF THE INVENTION

It is an object of the invention to provide a silicon wafer from a single crystal silicon in which the generation of dislocation clusters is effectively prevented on the outer and inner portions of the OSF rings.

It is another object of the invention to provide a method to manufacture a single crystal silicon in such a manner that the generation of dislocation clusters on the outer portion of the OSF ring and the generation of vacancy clusters on the inner portion are effectively prevented.

The present inventors unexpectedly found that the use of low pulling rate and the addition of nitrogen to the silicon melt was effective not only in suppressing vacancy clusters generated at the inner portion of the OSF ring but also in suppressing the formation of dislocation clusters generated at the outer portion of the OSF ring. In this way, high quality wafers could be produced which are essentially free of defects. It was also discovered that the concentration of nitrogen in the silicon melt should be maintained at a minimum level in order to attain the benefits of the invention.

DETAILED DESCRIPTION OF THE PREFERRED EMBODIMENTS

Figure 1:
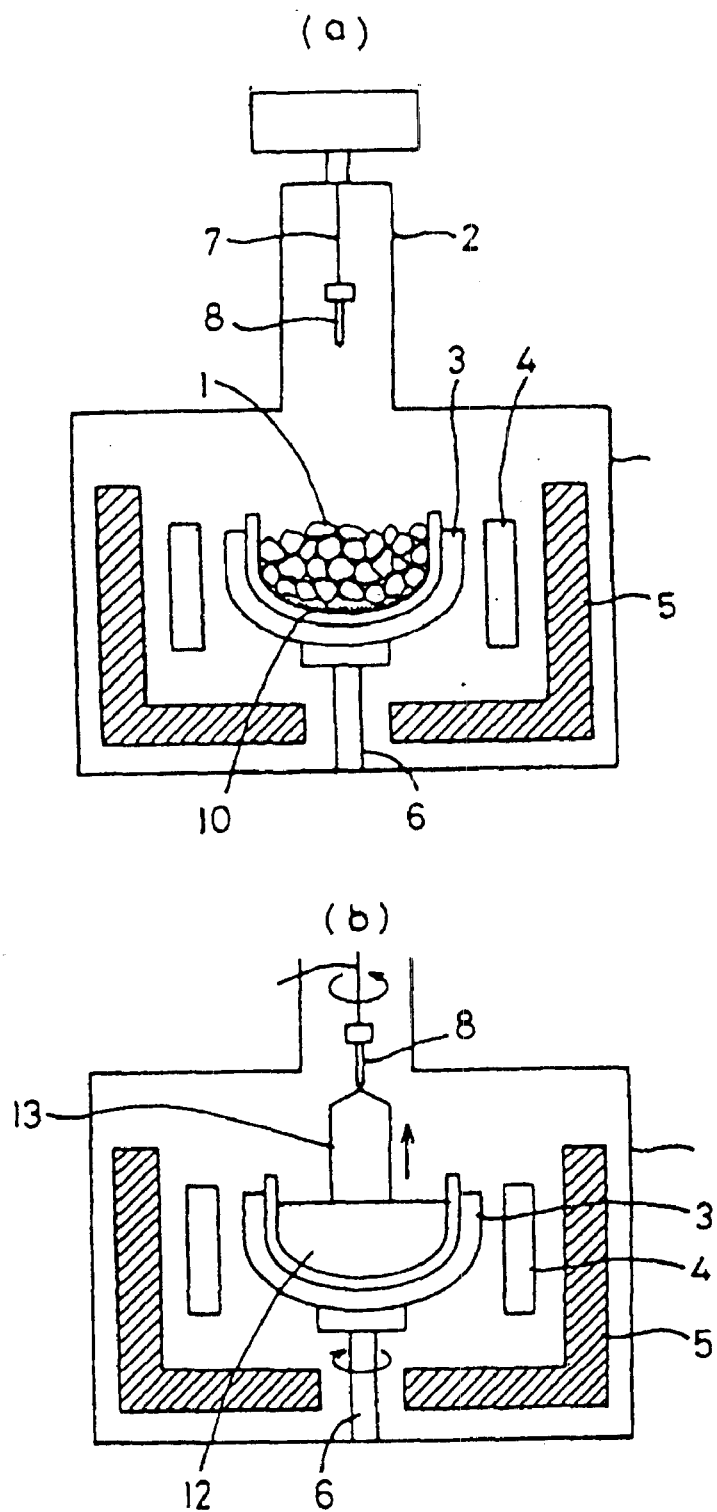
FIGS. 1($a$) and 1($b$) represent an embodiment of the present invention, including an apparatus for melting the raw materials, and a process for pulling a single crystal silicon.

It has been observed that nitrogen suppresses the transfer of vacancy so as to inhibit their aggregation and this is effective in suppressing vacancy clusters. The reason why nitrogen is effective in suppressing dislocation clusters may be as follows. The addition of nitrogen suppresses the transfer of vacancy and the aggregation of vacancy is prevented. However, the overall concentration of vacancy in a crystal increases. Dislocation clusters are generated when silicon interstitial concentration is larger than the critical concentration. When the vacancy concentration in the crystal increases due to the addition of nitrogen, the concentration of the interstitial silicon decreases and the generation of dislocation cluster is suppressed.

The prior art in which nitrogen doped FZ silicon wafers or CVD silicon nitride film coated wafers are added to the poly-silicon raw material, is not desirable because an additional step in the manufacturing process is necessary. In the prior art, poly-silicon raw material is melted in a nitrogen gas atmosphere, the nitrogen concentration in the silicon melt cannot be accurately controlled. When nitrogen gas bubbles in the silicon melt, bubbles are created and the bubbles cause dislocation. To avoid these problems, the use of silicon nitride powder has been suggested.

However, the melting point of silicon nitride is higher than that of silicon. Accordingly, the addition of silicon nitride powder to the silicon melt or admixing silicon nitride powder with solid poly-silicon caused problems because undissolved silicon nitride powder was incorporated into the single crystal silicon and induced dislocation.

The present inventors discovered that the above described problems could be solved by placing the silicon nitride powder on the bottom of the crucible before the poly-silicon was added. This method prevents random scattering of the powder and lowered the melting temperature of silicon nitride compound, so no insoluble powder remained. Thus the dissolution of the silicon nitride powder was improved.

Another embodiment of this invention is a CZ silicon wafer where an OSF ring exists or disappears at the center thereof. These wafers are produced by the CZ method using low pulling rate from the silicon melt doped with nitrogen and the nitrogen concentration is not less than about $1\times10^{13}$ atoms/cm$^3$ Preferably, the silicon melt is prepared by melting the raw materials in the crucible after the silicon nitride powder has been placed on the bottom of the crucible followed by addition of the poly-silicon.

When the crystal is produced at a low pulling rate and the nitrogen concentration is not less than about $1\times10^{13}$ atoms/cm$^3$, the density of vacancy clusters at the inside of the OSF ring decreases and dislocation clusters disappear at the outside of the OSF ring. The vacancy clusters which exist at the inside of the OSF ring have a size of not less than about 0.13 $\mu$m in diameter. The density of vacancy clusters becomes not more than about 0.5 pieces/cm$^2$ after SC1 cleaning. In addition, there are substantially no dislocation clusters at the outside of the OSF ring. In other words, when the nitrogen concentration in the crystal is not less than about $1\times10^{13}$ atoms/cm$^3$, the generation of vacancy clusters and dislocation clusters is suppressed. The nitrogen concentration is preferably not less than about $5\times10^{13}$ atoms/cm$^3$, and more preferably not less than about $1\times10^{14}$ atoms/cm$^3$. The upper limit of the nitrogen concentration is not particularly restricted. However, when the nitrogen concentration becomes extremely high, dislocations are easily generated. Accordingly, the nitrogen concentration is preferably not more than about $5\times10^{15}$ atoms/cm$^3$, and more preferably not more than about $1\times10^{15}$ atoms/cm$^3$.

A vacancy cluster and a dislocation cluster can be observed by etching the surface of a wafer to develop a pit thereon. The size and density of the pit change in accordance with the etching condition. The size and the density of the vacancy clusters developed according to the present invention represent the cluster generated after one time SC1 cleaning. The SC1 cleaning is a pretreatment method generally utilized for determining defects in the wafer. Typically, a wafer is treated by a cleaning solution whose component ratio of $NH_4OH$: $H_2O_2$: $H_2O$ is about 1:1:5, where the conditions are maintained at about 75° C. for about 10 minutes.

The density of vacancy clusters is preferably not more than about 0.1 pieces/cm$^2$.

The density thereof is defined by the density of vacancy clusters per unit area at the inside of the OSF ring.

The pulling rate should be maintained at a low rate. The preferred rate is that which provides the smallest area of vacancy clusters. Where the maximum outside diameter of a produced crystal is defined as $D_{max}$ and a minimum outside diameter thereof is defined as $D_{min}$, a single crystal silicon should be produced at a pulling rate of not more than about 0.7 times the maximum pulling rate. The maximum pulling rate is defined as the pulling rate which yields a deformation ratio of the crystal of about 2% when measured by $(D_{max}-D_{min})/D_{min}\times100\%$. Although vacancy clusters at the inside of the OSF ring decrease, the vacancy clusters do not completely disappear. It is preferred that the pulling rate should be as slow as possible. At 0.7 times the maximum pulling rate, the OSF rings will generate at the half region in the direction of the crystal radius. At 0.6 times, the OSF rings will disappear at the center of the crystal. The wafer in which the OSF rings disappear at the center of the crystal has no vacancy clusters at the inside of the OSF ring and also no dislocation clusters at the outside of the OSF ring.

An apparatus suitable for producing a crystal comprises a main chamber 1 and a pull chamber 2 connected to a center portion of an upper surface thereof. The apparatus includes a vacuum chamber having a cylindrical shape with the axis direction being essentially vertical, and includes a water cooling system (not shown). In the main chamber 1, a crucible 3 is arranged approximately in the center, and a heater 4 and a heat insulator tube 5 are arranged at the outside of the crucible 3.

The crucible 3 comprises an inner quartz crucible and an outer graphite susceptor, and is connected to a supporting axis 6, which revolves and can be raised and lowered. A pulling axis 7 which is capable of rotating, and of being raised and lowered is provided in the pull chamber above the crucible 3. A seed crystal 8 is connected to the lower end of the pulling axis 7.

When a crystal is to be grown, silicon nitride powder 10 is first charged on the bottom of the quartz crucible 3 as shown in FIG. 1(a) and a poly-silicon 11 is then charged thereon. The amount of silicon nitride powder 10 is adjusted to provide a nitrogen concentration in a top part of the crystal of not less than about $1\times10^{13}$ atoms/cm$^3$, in consequence the nitrogen concentration in a bottom part of the crystal is not less than about $5\times10^{13}$ atoms/cm$^3$.

After charging the materials, the heater 4 is operated under a vacuum and the materials in the crucible 3 are melted. This provides a silicon melt 12 doped with nitrogen (see FIG. 1(b)).

After preparing the silicon melt 12, the seed crystal 8 is dipped therein. Then, the crucible 3 and the pulling axis 7 are elevated while rotating in opposite directions. Thus, a single crystal silicon 13 is produced below the seed crystal 8. The pulling rate is controlled so that the OSF rings locate between the outer peripheral and the center, or disappear at the center.

So the single crystal silicon 13 grown as described above includes nitrogen in an amount of not less than about $1\times10^{13}$ atoms/cm$^3$, the generation of vacancy clusters at the inside of the OSF ring is suppressed and there are no dislocation clusters at the outside of the OSF ring. As a result, the present process ensures the production of high quality crystals.

EXAMPLES

The examples of the present invention described below are given by way of illustration and are not intended to limit the invention.

A various amount of silicon nitride powders were charged on the bottom of a quartz crucible. The particle size of the powders was about 0.5 $\mu$m. Next, 100 kg of a poly-silicon was charged followed by 0.6 g of a boron-silicon alloy dopping as a p-type dopant. After charging the materials, an Ar atmosphere of 10 Torr was provided in the chamber and heater power was set at 70 kw, to melt the materials. Thereafter, a single crystal rod having a diameter of 8 inches (20.32 cm) was pulled to a length of 1000 mm from a seed crystal with orientation of (100). The pulling rate was about 0.5 mm/min which corresponded to a rate of approximately 0.6 times the maximum pulling rate under this pulling condition.

For comparative purposes, the same crystal producing procedure was performed (1) without silicon nitride powder or (2) charging the silicon nitride powder after charging the poly-silicon.

Studies were conducted in which the amount of silicon nitride powder was varied. A sample wafer was obtained 500 mm from the top of the produced single crystal silicon rod and was measured to determine nitrogen concentration, vacancy clusters, and dislocation clusters. The results are shown in Table 1. With respect to vacancy clusters, the nitrogen concentration was measured by SIMS. The vacancy clusters were examined by Laser Particle Counter (KLA-Tencor SFS-6220) as LPD (Light Point Defects) of not less than 0.13 $\mu$m after mirror polishing and one time SC-1 cleaning. With respect to dislocation clusters, the sample was etched using a secco-etchant, then the dislocation clusters were counted as pits using an optical microscope at a magnification of 100. The diameter of the vacancy cluster area, inner diameter of the OSF ring was about 40 mm.

TABLE 1

| | | Comparative Examples | | | Examples according to the present invention | | | | | |
|---|---|---|---|---|---|---|---|---|---|---|
| Powder | Charging Method | — | B | A | A | A | A | A | A | A |
| | Amount | — | 360 mg | 1080 mg | 720 mg | 360 mg | 180 mg | 90 mg | 45 mg | |
| Wafer | Nitrogen concentration | Not detectable | $1.6 \times 10^{14}/cm^3$ | $6 \times 10^{14}/cm^3$ | $4 \times 10^{14}/cm^3$ | $2 \times 10^{14}/cm^3$ | $1 \times 10^{14}/cm^3$ | $5 \times 10^{12}/cm^3$ | $2.5 \times 10^{13}/cm^3$ | |
| | Density of dislocation pits | $3 \times 10^3/cm^2$ | $0/cm^2$ | $0/cm^2$ | $0/cm^2$ | $0/cm^2$ | $0/cm^2$ | $0/cm^2$ | $0/cm^2$ | |
| | Density of LPD | 15/wafer | 7/wafer | 4/wafer | 4/wafer | 5/wafer | 4/wafer | 6/wafer | 7/wafer | |
| | Density of LPD | $0.95/cm^2$ | $0.44/cm^2$ | $0.25/cm^2$ | $0.25/cm^2$ | $0.32/cm^2$ | $0.25/cm^2$ | $0.38 \, m^2$ | $0.44 \, cm^2$ | |
| Dislocation-free rate | | 5/5 | 2/5 | 5/5 | 5/5 | 5/5 | 5/5 | 5/5 | 5/5 | |

Introducing Method
A: Silicon raw material was charged after charging silicon nitride powder.
B: Powder was charged after poly-silicon raw material was charged.

When nitrogen was doped at a concentration of not less than $1 \times 10^{13}$ atoms/cm$^3$, the density of LPD (i.e., density of vacancy clusters) significantly decreased and the dislocation pits disappeared. However, if the silicon nitride powder was charged after charging the poly-silicon, the dislocation-free rate decreased apparently due to the presence of insoluble powder, and the nitrogen concentration in the crystal decreased to below the desired value.

As described above, silicon wafers produced in accordance with the present invention have minimal crystal defects. The wafers produced are of high quality. The method of the present invention suppresses the generation of dislocation clusters, and vacancy clusters. Therefore, high quality wafers can be produced at a low cost by the CZ procedure.

Obviously, numerous modifications and variations of the present invention are possible in light of the above teachings. It is therefore to be understood that it is within the scope of the invention to practice otherwise than as specifically described herein.

What is claimed is:

1. A method for producing a silicon wafer produced by a Czochralski (CZ) method at a pulling rate wherein oxidation induced stacking faults (OSF) ring exist or disappear at a center, and wherein a nitrogen concentration of the silicon wafer is not less than about $1 \times 10^{13}$ atoms/cm$^3$.

2. A method for producing a silicon wafer by using a single crystal silicon produced by a Czochralski (CZ) method at a pulling rate wherein oxidation induced stacking faults (OSF) ring exist or disappear at a center, and wherein said silicon wafer has a nitrogen concentration of not less than about $1 \times 10^{13}$ atoms/cm$^3$, and has vacancy clusters of not less than 0.13 $\mu$m in diameter and not more than about 0.5 pieces/cm$^2$ after the SC1 cleaning, and wherein substantially no dislocation clusters exist at an outside of the OSF ring.

3. A process for producing a single crystal silicon using a CZ method wherein the pulling rate is such that OSF rings exist between outer peripheral and the center, wherein the nitrogen concentration of the single crystal silicon is not less than about $1 \times 10^{13}$ atoms/cm$^3$.

4. A process for producing a single crystal silicon according to claim 3, wherein the nitrogen doping is accomplished by charging silicon nitride powder on the bottom of a quartz crucible, then charging a poly-silicon raw material to the crucible and heating to produce a silicon melt.

5. A process for producing a single crystal silicon according to claim 3, wherein the single crystal silicon is produced at a pulling rate not more than about 0.7 times the maximum pulling rate.

6. A process according to claim 5, wherein the pulling rate is not more than about 0.6 times the maximum pulling rate.

7. A process for producing a single crystal silicon by the CZ process, wherein the pulling rate is not more than about 0.7 times the maximum pulling rate and silicon nitride is added to the silicon melt in an amount sufficient to provide a nitrogen concentration in the silicon melt and in the crystal produced therefrom of not less than about $1 \times 10^{13}$ atoms/cm$^3$.

* * * * *